(12) United States Patent
Asaki et al.

(10) Patent No.: US 10,199,081 B1
(45) Date of Patent: Feb. 5, 2019

(54) APPARATUSES AND METHODS FOR PROVIDING BIAS SIGNALS IN A SEMICONDUCTOR DEVICE

(71) Applicant: MICRON TECHNOLOGY, INC., Boise, ID (US)

(72) Inventors: Kenji Asaki, Sagamihara (JP); Shuichi Tsukada, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/833,688

(22) Filed: Dec. 6, 2017

(51) Int. Cl.
 *H03B 1/00* (2006.01)
 *G11C 7/12* (2006.01)
 *H03K 17/687* (2006.01)

(52) U.S. Cl.
 CPC .............. *G11C 7/12* (2013.01); *H03K 17/687* (2013.01)

(58) Field of Classification Search
 CPC .............. G05F 3/30; G05F 1/575; H02M 3/07
 See application file for complete search history.

(56) References Cited

U.S. PATENT DOCUMENTS

2009/0225999 A1* 9/2009 Lee ................. H04R 1/1091
 381/74
2018/0026527 A1* 1/2018 Tai .................. G01R 19/16576
 327/536

* cited by examiner

*Primary Examiner* — Sibin Chen
(74) *Attorney, Agent, or Firm* — Dorsey & Whitney LLP

(57) ABSTRACT

Apparatuses and methods for providing bias signals in a semiconductor device are described. As example apparatus includes a power supply line configured to provide a supply voltage and further includes first and second nodes. An impedance element is coupled between the power supply line and the first node and a first transistor having a gate, a source coupled to the first node, and a drain coupled to the second node. A reference line is configured to provide a reference voltage. A second transistor has a gate, a source coupled to the reference line, and a drain. The gate and the drain of the second transistor are coupled to the gate of the first transistor.

8 Claims, 6 Drawing Sheets

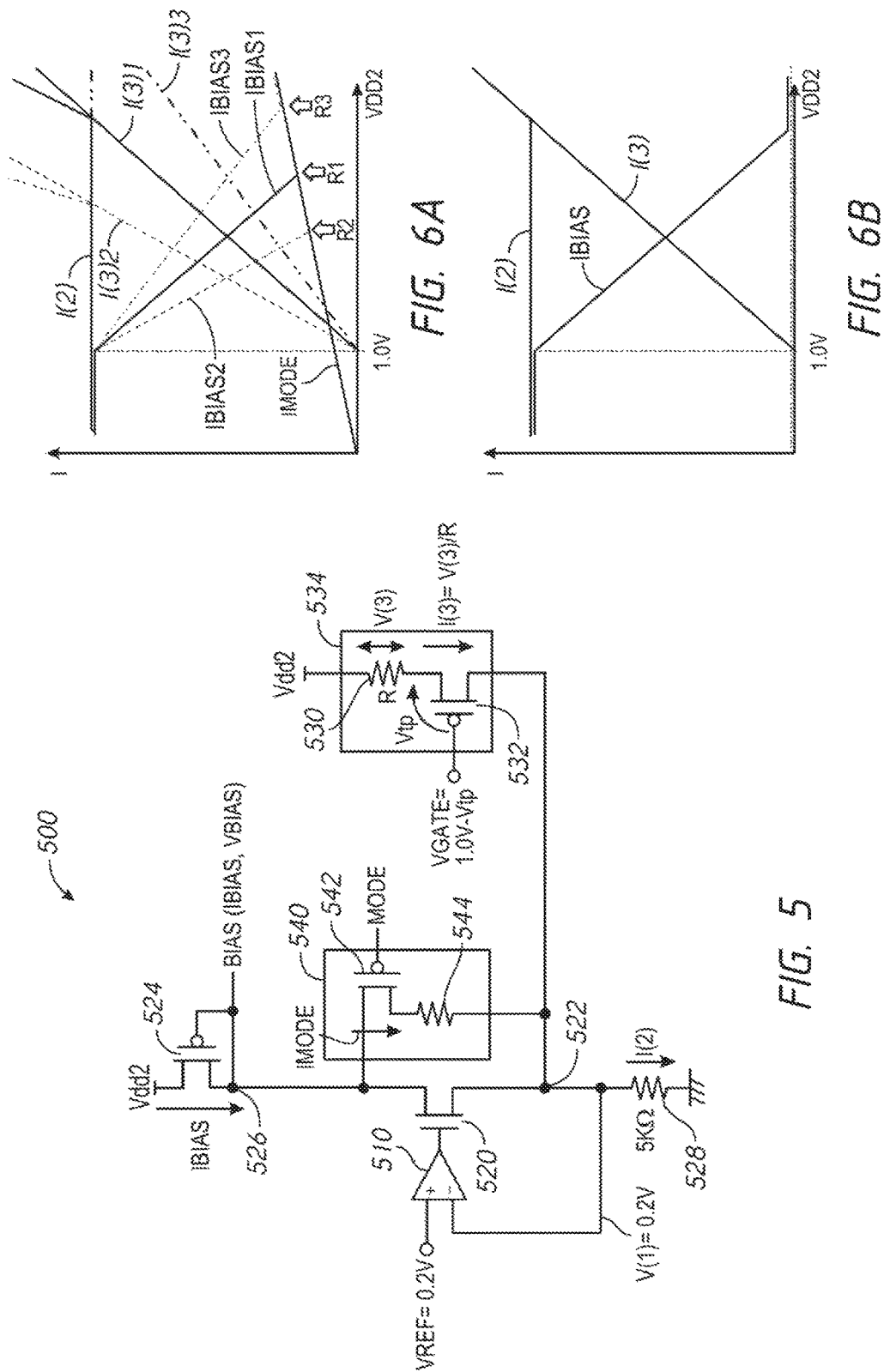

APPARATUSES AND METHODS FOR PROVIDING BIAS SIGNALS IN A SEMICONDUCTOR DEVICE

BACKGROUND

Semiconductor devices, such as memory devices, are widely used to store information in various electronic devices such as computers, wireless communication devices, cameras, digital displays, and the like. Information is stored by writing different states of a semiconductor device. For example, binary devices have two states, often denoted by a logic "1" or a logic "0." In other semiconductor devices, more than two states may be stored. To access the stored information, the semiconductor device may be read and the stored state is provided by the semiconductor device. Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others.

Operation of various circuits included in semiconductor devices may rely on bias signals provided by bias circuits. The bias circuits may be used to provide bias currents and/or bias voltages to the various circuits, such as buffer circuits, driver circuits, delay circuits, etc. The bias circuits may provide stable, reliable, and/or constant bias signals (e.g., current and/or voltage) to the various circuits for proper operation. Without the bias circuits, the semiconductor devices would be inoperable or operate poorly. Due to the importance of bias circuits for proper operation of semiconductor devices and the number different circuits that rely on bias circuits, having alternative bias circuit designs may be desirable.

BRIEF DESCRIPTION OF THE DRAWINGS

FIG. 5 is a schematic diagram of a bias circuit according to an embodiment of the disclosure.

FIG. 6A is a diagram showing various currents during operation of the bias circuit of FIG. 5 for a second operation mode according to an embodiment of the disclosure.

FIG. 6B is a diagram showing various currents during operation of the bias circuit of FIG. 5 for a first operation mode according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
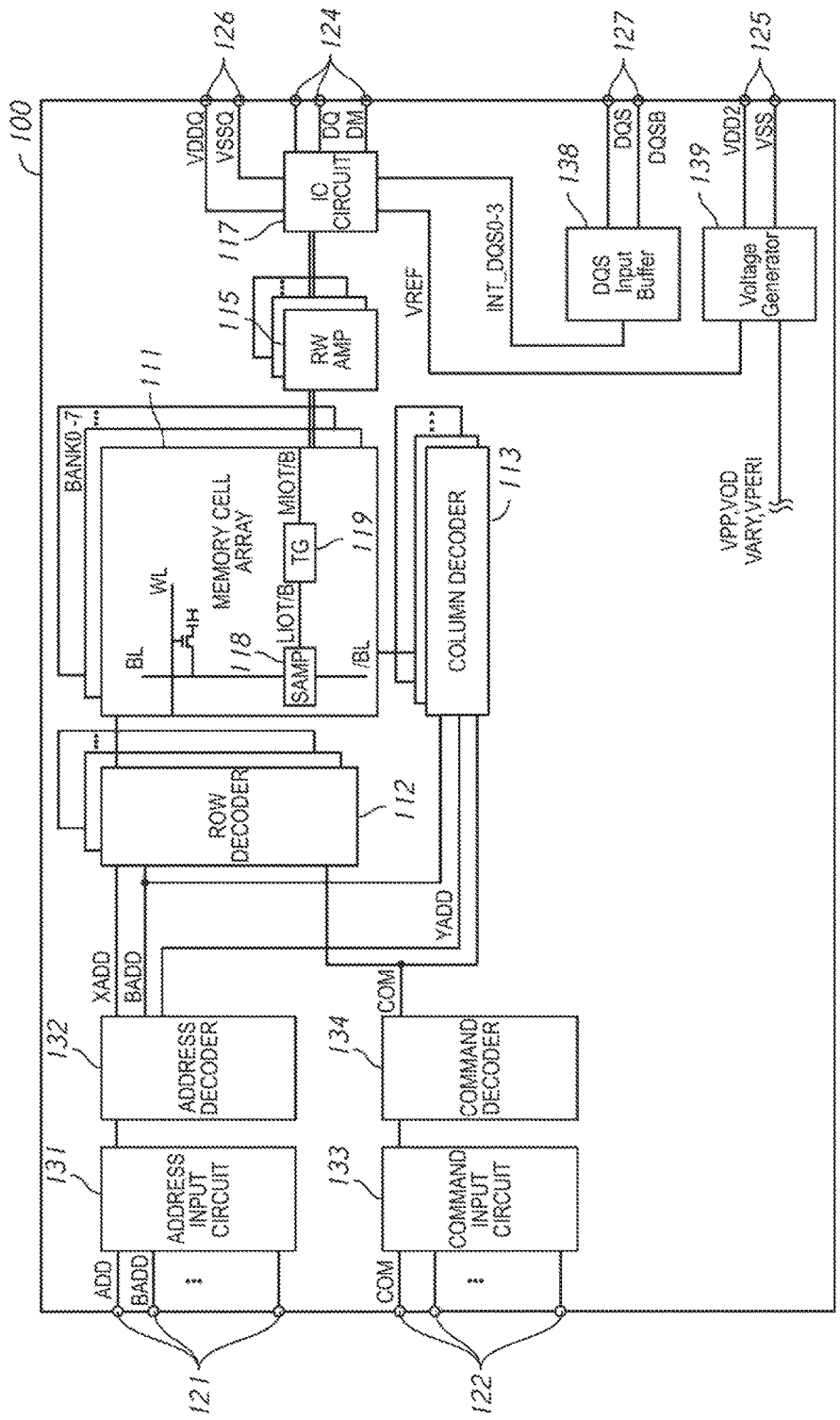
FIG. 1 is a block diagram of a semiconductor device according to an embodiment of the disclosure.

FIG. 1 is a block diagram of a semiconductor device 100 in accordance with an embodiment of the present disclosure. The semiconductor device 100 may be a memory device integrated into a single semiconductor chip, for example. Example memory devices include volatile and non-volatile memory. In some embodiments of the disclosure, the semiconductor device 100 may be a dynamic random access memory (DRAM), for example, an LPDDR4 SDRAM. In other embodiments of the disclosure, however, the semiconductor device 100 may be other types of memory.

The semiconductor device 100 includes a memory cell array 111. The memory cell array 111 includes a plurality of banks, with each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. Sense amplifiers 18 are coupled to corresponding bit lines BL and connected to local I/O line pairs LIOT/B. Local IO line pairs LIOT/B are connected to main IO line pairs MIOT/B via transfer gates TG 119 which function as switches.

The semiconductor device 100 further includes a plurality of external terminals, such as, address terminals 121, command terminals 122, data terminals 124, power supply terminals 125 and 126, and data strobe terminals 127. The data terminals 124 may be coupled to output buffers for read operations of memories. Alternatively, the data terminals 124 may be coupled to input buffers for read/write access of the memories. FIG. 1 shows an example of DRAM, however, any device having external terminals for signal input and output may be included as the external terminals of embodiments of the present disclosure.

The address terminals 121 are provided with an address signal ADD and a bank address signal BADD. The address signal ADD and the bank address signal BADD provided to the address terminals 121 are transferred via an address input circuit 131 to an address decoder 132. The address decoder 132 receives the address signal ADD and provides a decoded row address signal XADD to the row decoder 112, and a decoded column address signal YADD to the column decoder 113. The address decoder 132 also receives the bank address signal BADD and provides the bank address signal BADD to the row decoder 112 and the column decoder 113.

The command terminals 122 are provided with a command signal COM. The command signal COM may include one or more separate signals. The command signal COM input to the command terminals 122 is input to a command decoder 134 via the command input circuit 133. The command decoder 134 decodes the command signal COM to generate various internal command signals. For example, the internal commands may include a row command signal to select a word line and a column command signal, such as a read command or a write command, to select a bit line.

Accordingly, when a read command is issued and a row address and a column address are timely provided with the read command, read data is read from a memory cell MC in the memory cell array 111 designated by these row address and column address. The read data DQ is output externally from the data terminals 124 via a read/write amplifier 115 and an input/output (IO) circuit 117. Similarly, when the write command is issued and a row address and a column address are timely provided with this command, and then write data DQ is provided to the data terminals 124, the write data DQ is provided via the input/output circuit 117 and the read/write amplifier 115 to the memory cell array 111 and written in the memory cell MC designated by the row address and the column address. A data mask DM may be provided to the data terminals 124 with the write data DQ to selectively mask bits of the write data DQ that are ignored when the write data DQ is written to the memory cell array 111.

Data strobe signals DQS and DQSB may be provided to the data strobe terminals 127. The DQS and DQSB signals may be used for timing the receipt (e.g., buffer and/or latch) of write data DQ by the semiconductor device 100. The DQS and DQSB signals are provided to a DQS input buffer 138 which generates internal clock signals INT_DQS0-3. The INT_DQS0-3 signals may be used to clock circuits in the input/output circuit 117 to receive binary digits (bits) of the write data DQ. For example, the INT_DQS0-3 signals may clock data input circuits of the input/output circuit 117 to receive write data DQ provided to the data terminals 124.

The power supply terminals 125 are provided with power supply potentials VDD2 and VSS. These power supply potentials VDD2 and VSS are provided to a voltage generator 139. The voltage generator 139 generates various internal potentials VPP, VOD, VARY, VPER1, and the like based on the power supply potentials VDD2 and VSS. The internal potential VPP is mainly used in the row decoder 112, the internal potentials VOD and VARY are mainly used in the sense amplifiers 118 included in the memory cell array 111, and the internal potential VPER1 is used in many other circuit blocks.

The power supply terminals 126 are provided with power supply potentials VDDQ and VSSQ. These power supply potentials VDDQ and VSSQ are provided to the input/output circuit 117. In some embodiments of the disclosure, the power supply potentials VDDQ and VSSQ may be the same potentials as the power supply potentials VDD2 and VSS that are provided to the power supply terminals 125, respectively. However, the power supply potentials VDDQ and VSSQ may be used for the input/output circuit 117 so that power supply noise generated by the input/output circuit 117 does not propagate to the other circuit blocks.

Figure 2:
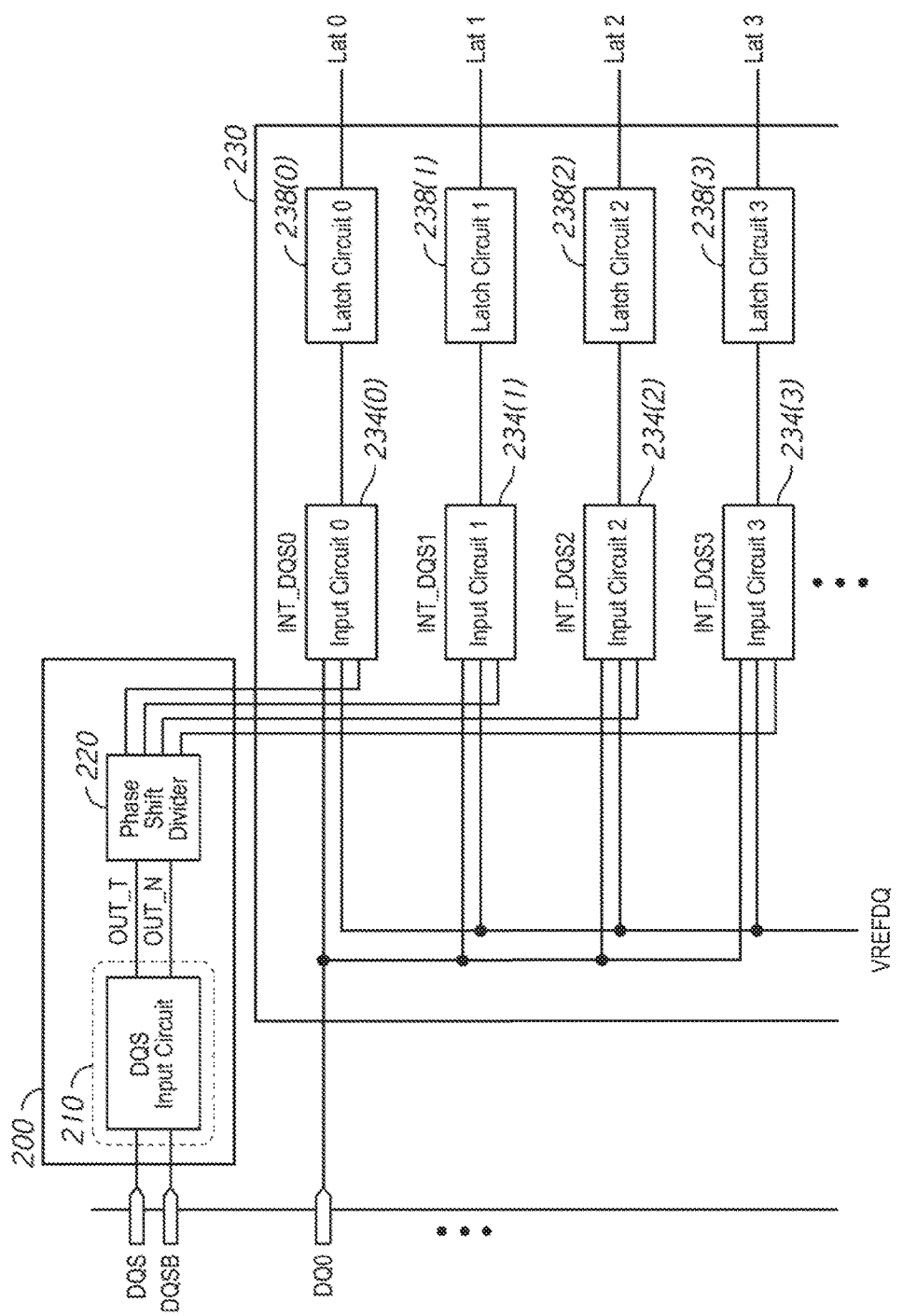
FIG. 2 is a block diagram of a DQS input buffer and a portion of an input/output circuit according to an embodiment of the disclosure.

FIG. 2 is a block diagram of a DQS input buffer 200 and a portion of an input/output circuit 230 according to an embodiment of the disclosure. The DQS input buffer 200 may be included in the DQS input buffer 138 of FIG. 1, and the input/output circuit 230 may be included in the input/output circuit 117 in some embodiments of the disclosure.

The DQS input buffer 200 receives strobe signals DQS and DQSB, and provides multiphase strobe signals INT_DQS0-3. The INT_DQS0-3 are provided to the input/output circuit 230. FIG. 2 shows a portion of the input/output circuit 230, in particular, the portion for one data terminal DQ0. The data terminal DQ0 may correspond to a data terminal of the semiconductor device 100 of FIG. 1, in some embodiments of the disclosure. Data may be provided to the data terminal DQ0 as a sequence of bits. The sequence of bits are represented by a data signal provided to the data terminal DQ0. Each of the bits is provided for a same time period. The time period for one bit of data may be, for example, one half the clock period of the DQS and DQSB signals. In order to accurately receive a bit of data, the bit of data must be latched by the semiconductor device 100 before the next bit of data is provided. The portion of the input/output circuit 230 shown for the data terminal DQ0 may be repeated for each of the remaining data terminals (e.g., DQ1-DQ3 for a four data terminal embodiment).

The DQS input buffer 200 includes an input circuit 210 that is provided strobe signals DQS and DQSB from data strobe terminals. The input circuit 210 provides output signals OUT_T and OUT_N based on the DQS and DQSB signals. The DQS and DQSB signals may be complementary. That is, a rising edge of the DQS signal and a falling edge of the DQSB signal occur at the same time and a falling edge of the DQS signal and a rising edge of the DQSB signal occur at the same time. The OUT_T and OUT_N signals may also be complementary and have the same clock frequency as the DQS and DQSB signals.

The OUT_T and OUT_N signals are provided to a phase shift divider circuit 220. The phase shift divider circuit 220 provides the multiphase clock signals INT_DQS0-3 based on the OUT_T and OUT_N signals. Each of the INT_DQS0-3 signals have a fixed phase relative to one another. For example, in some embodiments of the disclosure, the INT_DQS1 signal is phase shifted relative to the INT_DQS0 signal by 90 degrees, the INT_DQS2 signal is phase shifted relative to the INT_DQS1 signal by 90 degrees, and the INT_DQS3 signal is phase shifted relative to the INT_DQS2 signal by 90 degrees. The INT_DQS0-3 signals having a clock frequency less than the clock frequency of the OUT_T and OUT_N signals. The INT_DQS0-3 signals may have a clock frequency one-half of the clock frequency of the OUT_T sand OUT_N in some embodiments of the disclosure.

The input/output circuit 230 includes four sets of DQ input circuits 234(0)-234(3) and latch circuits 238(0)-238(3) for the data terminal DQ0. Each input circuit 234 is coupled to the data terminal DQ0 and is provided a respective one of the INT_DQS0-3 signals. A reference voltage VREFDQ is also provided to each of the DQ input circuits 234. The VREFDQ voltage is used by the DQ input circuits 234 to determine the logic levels of the bits of data of the data signal provided to the data terminal DQ0.

Each input circuit 234 is clocked by the respective INT_DQS0-3 signal to receive the data provided to the data terminal DQ0 at the time of clocking. With each of the INT_DQS0-3 signals having relative phases to one another, and the INT_DQS0-3 signals having one-half the clock frequency of the OUT_T and OUT_N signals (and of the DQS and DQSB signals), each of the DQ input circuits 234 is clocked at a different time over one clock period of the DQS and DQSB signals. After the data is received, the DQ input circuit 234 provides the data to the respective latch circuit 238. The latch circuit 238 latches the data provided by the respective input circuit, and the latched data may be provided to circuits in a data path (not shown), for example, to a read/write amplifier (e.g., read/write amplifier 115 of FIG. 1).

Figure 3:
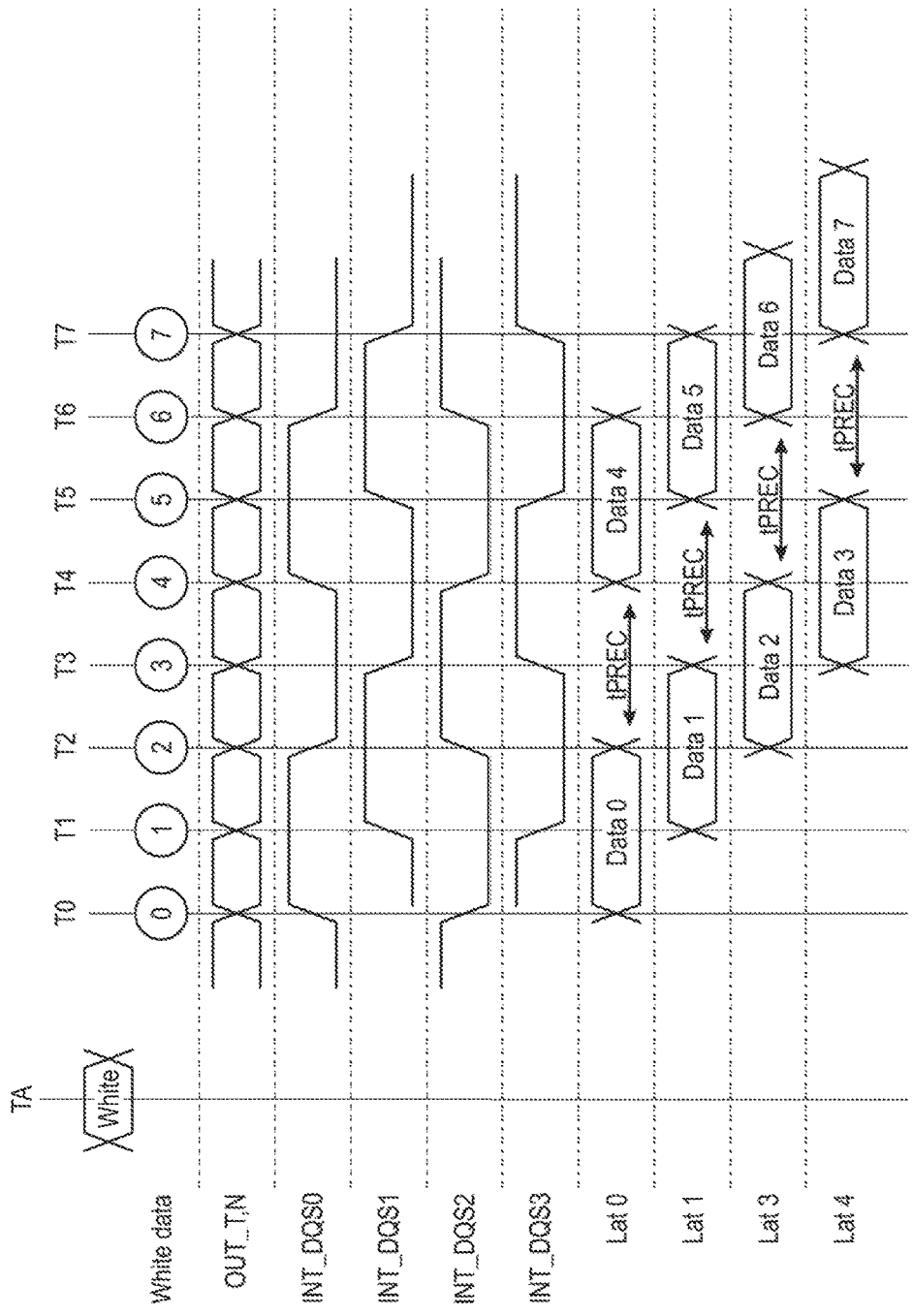
FIG. 3 is a timing diagram of various signals during the operation of the DQS input buffer and the input/output circuit of FIG. 2 according to an embodiment of the disclosure.

Operation of the DQS input buffer 200 and the input/output circuit 230 will be described with reference to FIGS. 2 and 3. FIG. 3 is a timing diagram of various signals during operation of the DQS input buffer 200 and the input/output circuit 230, according to an embodiment of the disclosure.

FIG. 3 illustrates a write operation for eight data bits provided to the data terminal DQ0 responsive to a write command.

At time TA, a write command is provided to the semiconductor device 100 which begins a write operation. Prior to time T0, active data strobe signals DQS and DQSB (not shown in FIG. 3) are provided to the input circuit 210 of the DQS input buffer 200, which provides the OUT_T and OUT_N signals based on the DQS and DQSB signals. The resulting OUT_T and OUT_N signals provided by the input circuit 210 are shown in FIG. 3. The OUT_T and OUT_N signals are provided to the phase shift divider circuit 220, which provides the multiphase signals INT_DQS0-3. The multiphase signals INT_DQS0-3 have a clock frequency that is one-half the clock frequency of the OUT_T and OUT_N signals (and of the DQS and DQSB signals), and each of the INT_DQS0-3 signals have a phase of 90 degrees relative to one another. The INT_DQS0-3 signals are shown in FIG. 3.

At time T0 a rising edge of the INT_DQS0 signal clocks the DQ input circuit 234(0) to receive a first bit of data (Data 0) provided to the DQ0 terminal. The DQ input circuit 234(0) then provides Data 0 to the latch circuit 238(0) to be latched. The latched Data 0 is shown in FIG. 3 following time T0. The data bit provided to the DQ0 terminal changes to a second bit of data (Data 1) at time T1. A rising edge of the INT_DQS1 signal clocks the DQ input circuit 234(1) to receive Data 1, which then provides Data 1 to the latch circuit 238(1) to be latched. The latched Data 1 is shown in FIG. 3 following time T1.

The data provided to the DQ0 terminal changes to third and fourth bits of data (Data 2 and Data 3) at times T2 and T3, respectively. A rising edge of the INT_DQS2 signal at time T2 clocks the DQ input circuit 234(2) to receive Data 2, which then provides Data 2 to the latch circuit 238(2). A rising edge of the INT_DQS3 signal at time T3 clocks the DQ input circuit 234(3) to receive Data 3, which then provides Data 3 to the latch circuit 238(3). Latched Data 2 is shown in FIG. 3 following time T2 and latched Data 3 is shown following time T3.

By the time the fifth bit of data (Data 4) is provided to the DQ0 terminal at time T4, latched Data 0 has already been provided and the latch circuit 238(0) has been precharged over time tPREC to be ready to latch new data. A rising edge of the INT_DQS0 signal at time T4 clocks the DQ input circuit 234(0) to receive Data 4, which then provides latched Data 4 to the latch circuit 238(0). Latched Data 4 is shown in FIG. 3 following time T4. The latch circuit 238(1) similarly precharged over time tPREC and is ready to latch new data by the time a sixth bit of data (Data 5) is provided to the DQ0 terminal at time T5. A rising edge of the INT_DQS1 signal at time T5 clocks the DQ input circuit 234(1) to receive Data 5, which then provides latched Data 5 to the latch circuit 238(1). Latched Data 5 is shown in FIG. 3 following time T5.

The latch circuit 238(2) is precharged over time tPREC and is ready to receive new data by time T6 and the latch circuit 238(3) is precharged over time tPREC and is ready to receive new data by time T7. A rising edge of the INT_DQS2 signal at time T6 clocks the DQ input circuit 234(2) to receive a seventh bit of data (Data 6), which then provides latched Data 6 to the latch circuit 238(2). A rising edge of the INT_DQS3 signal at time T7 clocks the DQ input circuit 234(3) to receive an eighth bit of data (Data 7), which then provides latched Data 7 to the latch circuit 238(3). Latched Data 6 is shown in FIG. 3 following time T6 and latched Data 7 is shown following time T7.

As shown by the example of FIG. 3, the INT_DQS0-3 signals may be used to clock DQ input circuits 234(0)-234(3) to receive eight bits of data (Data 0 through Data 7) at a data terminal over eight consecutive transitions of the DQS and DQSB signals (which are used to provide the OUT_T and OUT_N signals). It will be appreciated that greater or fewer bits of data may be received in other embodiments of the disclosure. More generally, the example of FIG. 3 is not intended to limit the scope of the disclosure to the specific details described.

In some embodiments of the disclosure, two sets of DQ input circuits 234 and latch circuits 238 are included for each data terminal. As a result, four multiphase signals may be unnecessary, and only two periodic signals used instead. In such embodiments, the phase shift divider 220 may be unnecessary, and the OUT_T and OUT_N signals may be used to clock the DQ input circuits 234. Alternatively, where the phase shift divider 220 is included, two of the four multiphase signals may be used to clock the two DQ input circuits 234 in such embodiments. As a result, the two DQ input circuits 234 may be clocked at different times over one period of the DQS and DQSB signals.

Figure 4:
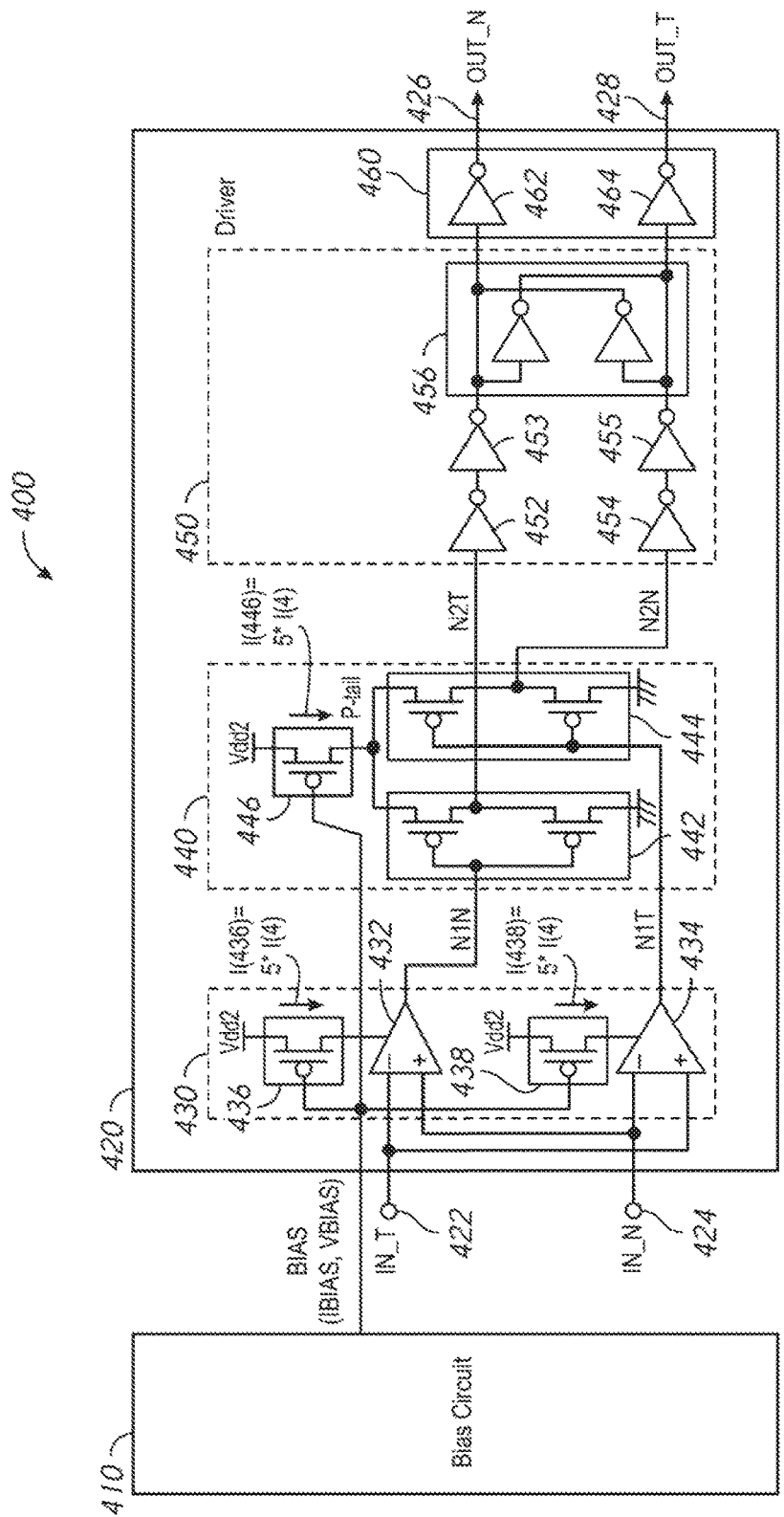
FIG. 4 is a schematic diagram of an input circuit according to an embodiment of the disclosure.

FIG. 4 is a schematic diagram of an input circuit 400 according to an embodiment of the disclosure. The input circuit 400 may be included in the input circuit 210 of FIG. 2 in some embodiments of the disclosure.

The input circuit 400 includes a bias circuit 410 and a buffer circuit 420. The bias circuit 410 provides a bias signal BIAS to the buffer circuit 420 during operation. The bias signal may include a bias current IBIAS and/or a bias voltage VBIAS. The buffer circuit 420 receives input signals IN_T and IN_N at input nodes 422 and 424 and provides output signals OUT_N and OUT_T at output nodes 426 and 428, all respectively. In some embodiments of the disclosure, the IN_T and IN_N are complementary external data strobe signals provided from DQS and DQSB terminals. As will be described in more detail below, the bias circuit 410 provides the BIAS signal with a magnitude that adjusts to compensate for variations in the operating conditions for the input circuit 400 (e.g., voltage, temperature, process, etc.) that may cause the timing of the OUT_N and OUT_T signals to change.

The buffer circuit 420 includes an input stage 430, an inverter stage 440, an output stage 450, and a driver stage 460. The input stage 430 includes amplifier circuits 432 and 434 that receive input signals IN_T and IN_N. The IN_T and IN_N signals may be complementary. The amplifier circuit 432 is coupled to the input node 422 to receive the IN_T signal at a negative (−) node and coupled to the input node 424 to receive the IN_N signal at a positive node (+). The amplifier circuit 432 provides an output signal N1N based on the IN_T and IN_N signals. The amplifier circuit 434 is coupled to the input node 422 to receive the IN_T signal at a positive (+) node and coupled to the input node 424 to receive the IN_N signal at a negative node (−). The amplifier circuit 434 provides an output signal N1T based on the IN_N and IN_T signals.

The amplifier circuit 432 is provided power (e.g., voltage and/or current) by a power circuit 436 that is coupled to a power supply line providing a supply voltage (e.g., VDD2). The power supply line may be coupled to a power supply circuit that provides the supply voltage to the power supply line. The amplifier circuit 434 is provided power by a power circuit 438 that is coupled to a power supply line providing the supply voltage. The power circuits 436 and 438 provide power to the amplifier circuits 432 and 434 having a magnitude as controlled by the BIAS signal (e.g., IBIAS current and/or VBIAS voltage). The power circuit 436 provides current I(436) and the power circuit 438 provides current I(438). As the VBIAS voltage increases, the power circuits 436 and 438 provide less power (e.g., less current) to the amplifier circuits 432 and 434. Conversely, as the VBIAS voltage decreases, the power circuits 436 and 438 provide higher power (e.g., higher current). As will be described below, in some embodiments of the disclosure the current provided by the power circuits 436 and 438 may be scaled relative to the IBIAS current. As shown in the embodiment of FIG. 4, the power circuits 436 and 438 include respective p-channel (e.g., p-type) transistors. In other embodiments of the disclosure, however, other circuits may be used to control power provided to the amplifier circuits 432 and 434 based on the BIAS signal (e.g., IBIAS current and/or VBIAS voltage) provided by the bias circuit 410.

The inverter stage 440 includes an inverter circuit 442 having an input coupled to receive the N1N signal. The inverter circuit 442 inverts the N1N signal to provide an output signal N2T having a level complementary to the N1N signal level. The inverter stage 440 further includes inverter circuit 444 having an input coupled to receive the N1T signal. The inverter circuit 444 inverts the N1T signal to provide an output signal N2N having a level complementary to the N1T signal level. The inverter circuits 442 and 444 are coupled to a power circuit 446 and to a power supply line providing a voltage reference (e.g., ground). The power supply line may be coupled to the voltage reference to provide a supply voltage of ground, for example.

The power circuit 446 provides power to the inverter circuits 442 and 444 having a magnitude that is controlled by the BIAS signal (e.g., IBIAS current and/or VBIAS voltage). The power circuit 446 provides current I(446). As the VBIAS voltage increases, the power circuit 446 provides less power (e.g., less current) to the inverter circuits 442 and 444. As the VBIAS voltage decreases, the power circuit 446 provides higher power (e.g., higher current). As will be described below, in some embodiments of the disclosure the current provided by the power circuit 446 may be scaled relative to the IBIAS current. As shown in the embodiment of FIG. 4, the power circuit 446 includes a p-channel (e.g., p-type) transistor. In other embodiments of the disclosure, however, other circuits may be used to control power provided to the inverter circuits 442 and 444 based on the BIAS signal (e.g., IBIAS current and/or VBIAS voltage) provided by the bias circuit 410.

The N2T and N2N signals are provided by the inverter stage 440 to the output stage 450. The output stage 450 includes series coupled inverter circuits 452 and 453, and further includes series coupled inverter circuits 454 and 455. A latch circuit 456 receives the output signals of the inverter circuits 453 and 455. Although not expressly shown in FIG. 4, one or more of the inverter circuits of the output stage 450 may be provided power by a power supply line providing the supply voltage previously described with regards to the power circuits 436, 438 and 446. The output stage 450 conditions the N2T and N2N signals before being provided to a driver stage 460. The driver stage 460 includes an inverter circuit 462 that provides an output signal OUT_N and includes an inverter circuit 464 that provides an output signal OUT_T. The OUT_N and OUT_T signals are complementary and have the same clock frequency as the IN_T and IN_N signals.

In operation, the buffer circuit 420 receives the IN_T and IN_N signals, buffers the IN_T and IN_N signals, and provides the OUT_N and OUT_T signals. The buffer circuit 420 amplifies the IN_T and IN_N signals, which may be external signals as previously described, with consumption of current generated responsively to the BIAS signal (e.g., IBIAS current and/or VBIAS voltage) to provide the OUT_N and OUT_T signals. The bias circuit 410 provides the BIAS signal to the buffer circuit 420 to maintain a timing through the buffer circuit 420. For example, a path delay from the input nodes 422 and 424 to the output nodes 426 and 428, remains relatively constant despite variations in the operating conditions (e.g., voltage, temperature, process, etc.) for the input circuit 400. The path delay includes the propagation delays through the input stage 430, the inverter stage 440, the output stage 450, and the driver stage 460. The propagation delay of the driver stage 460, however, may be short and can be ignored in some embodiments of the disclosure.

The output stage 450 of the buffer circuit 420 has a characteristic of a decreasing propagation delay for an increasing supply voltage and an increasing propagation delay for a decreasing supply voltage. The decreasing propagation delay of the output stage 450 may be caused by an increase in drive strength for the inverter circuits 452-455, and the inverter included in the latch circuit 456 when the supply voltage is greater. The increased drive strength results in faster signal transitions, which decreases the propagation delay of the output stage 450. Conversely, the increasing propagation delay of the output stage 450 may be caused by a decrease in drive strength for the inverter circuits 452-455, and the inverter included in the latch circuit 456 when the supply voltage is lower. The decreased drive strength results in slower signal transitions, which increases the propagation delay of the output stage 450. To compensate for the characteristic of the output stage 450, the propagation delays of the input stage 430 and the inverter stage 440 may be increased or decreased based on the BIAS signal.

As will be described in more detail below, the bias circuit 410 provides a decreasing IBIAS current for an increasing supply voltage, and the decreasing IBIAS current causes the propagation delays of the input stage 430 and the inverter stage 440 to increase. Thus, the propagation delays of the input stage 430 and the inverter stage 440 increase for an increasing supply voltage. Conversely, the bias circuit 410 provides an increasing IBIAS current for a decreasing supply voltage, and the increasing IBIAS current causes the propagation delays of the input stage 430 and the inverter stage 440 to decrease. Thus, the propagation delays of the input stage 430 and the inverter stage 440 decrease for a decreasing supply voltage.

An increasing propagation delay of the input stage 430 and the inverter stage 440 may compensate for the decreasing propagation delay of the output stage 450 when the supply voltage increases. Conversely, a decreasing propagation delay of the input stage 430 and the inverter stage 440 may compensate for an increasing propagation delay of the output stage 450 when the supply voltage decreases. As a result, the overall path delay through the buffer circuit 420 is maintained relatively constant although the supply voltage may vary.

The propagation delay of the input stage 430 may be adjusted by controlling the power circuits 436 and 438 that provide power to the amplifier circuits 432 and 434. The propagation delay of the amplifier circuits 432 and 434 increases as the power provided by the power circuits 436 and 438 decreases. The propagation delay of the amplifier circuits 432 and 434 decreases as the power provided by the power circuits 436 and 438 increases. The power circuits 436 and 438 provide less power as the VBIAS voltage increases and provide more power as the VBIAS voltage decreases.

The propagation delay of the inverter stage 440 may be adjusted by controlling the power circuit 446 that provides power to the inverter circuits 442 and 444. The propagation delay of the inverter circuits 442 and 444 increases as the power provided by the power circuit 446 decreases. The propagation delay of the inverter circuits 442 and 444 decreases as the power provided by the power circuits 446 increases. The power circuit 446 provides less power as the VBIAS voltage increases and provides more power as the VBIAS voltage decreases.

The bias circuit 410 of the input circuit 400 provides decreasing IBIAS current when the supply voltage increases and provides increasing IBIAS current when the supply voltage decreases. As a result, as the IBIAS current decreases, the propagation delays of the input stage 430 and the inverter stage 440 increases, and as the IBIAS current increases, the propagation delays of the input stage 430 and the inverter stage 440 decreases.

FIG. 5 is a schematic diagram of a bias circuit 500 according to an embodiment of the disclosure. The bias circuit 500 provides a bias current IBIAS and a bias voltage VBIAS having magnitudes based on a supply voltage (e.g., VDD2). As the supply voltage varies, the IBIAS current and VBIAS voltage are adjusted. The bias circuit 500 may be included in the bias circuit 410 of FIG. 4 in some embodiments of the disclosure.

The bias circuit 500 includes an amplifier circuit 510 having an output node coupled to a gate of a transistor 520. The amplifier circuit 510 has a positive (+) input node that is provided a reference voltage VREF, and further has a negative (−) input node that is coupled to a node 522. A source of the transistor 520 is also coupled to the node 522. A resistance 528 (e.g., an impedance element) is also coupled to the node 522 and to a power supply line providing reference voltage (e.g., ground). The resistance 528 may be 5 KOhms in some embodiments of the disclosure, but the scope of the disclosure is not limited to a resistance of this particular value.

The amplifier circuit 510 and the transistor 520 are used to set a voltage at the node 522 (identified in FIG. 5 as V(1)) based on the VREF voltage. In particular, the voltage V(1) is equal to the VREF voltage. The VREF may be 0.2 volts in some embodiments of the disclosure. Consequently, the voltage V(l) at the node 522 is also 0.2 volts in these embodiments of the disclosure. Other voltages for VREF may be provided in other embodiments of the disclosure, however. A drain of the transistor 520 is coupled to a node 526. A gate and drain of transistor 524 are also coupled to the node 526. The transistor 524 is further coupled to a power supply line that provides a supply voltage (e.g., VDD2).

A current source 534 is coupled between the power supply line and the node 522. The current source includes a resistance 530 (e.g., impedance element) and transistor 532 coupled in series. In some embodiments of the disclosure, the resistance 530 may be an adjustable resistance having a resistance that may be adjusted (e.g., higher or lower resistance). The transistor 532 is provided a bias voltage VGATE. The VGATE voltage is used to set a voltage at a node between the resistance 530 and the transistor 532. For example, in some embodiments of the disclosure, the VGATE voltage is (1.0 V−Vtp) wherein Vtp is the threshold voltage of the transistor 532. As a result, the voltage at the node between the resistance 530 and the transistor 532 is 1.0 V. Other voltages for the VGATE voltage may be used in other embodiments of the disclosure, however. The resistance of the resistance 530 may be adjusted to alter the relationship between the change in the IBIAS current (and the VBIAS voltage) of the bias circuit 500 and the change in supply voltage. The current source 534 provides a current I(3) to the node 522 that increases with increasing supply voltage and decreases with decreasing supply voltage.

The bias circuit 500 further includes a mode circuit 540. The mode circuit 540 is coupled in parallel to the transistor 520 and includes a transistor 542 and a resistance 544 (e.g., an impedance element). The mode circuit 540 causes the bias circuit 500 to operate in a first operation mode when the transistor 542 is not activated (e.g., not conductive) and to operate in a second operation mode when the transistor 542 is activated (e.g., conductive). When activated, the mode circuit 540 provides a resistive current path between nodes 522 and 526. Activation of the transistor 542 is controlled by a mode signal MODE, with a low logic level MODE signal activating the transistor 542 and a high logic level MODE signal not activating the transistor 542. In some embodiments of the disclosure, the MODE signal may be provided by a mode control circuit. The mode control circuit may be included, for example, in a command decoder, such as command decoder 134 of the semiconductor device 100 of FIG. 1.

In operation, a bias current IBIAS and bias voltage VBIAS are provided at the node 526. The VBIAS voltage is based at least on a bias current IBIAS. For example, as the IBIAS current increases the VBIAS voltage decreases, and as the IBIAS current decreases the VBIAS voltage increases. As will be described in more detail below, the BIAS current increases as the supply voltage decreases, and the IBIAS current decreases as the supply voltage increases.

The IBIAS current is the difference between current I(2) of resistance 528 and current I(3) of the current source 534. The current I(2) is set by the voltage of node 522, which as previously described, is set by the VREF voltage provided to the amplifier circuit 510. As a result, the current I(2) is not dependent on the supply voltage, that is, the current I(2) remains constant even though the supply voltage may vary. For the present example, it is assumed that VREF=0.2 V and the resistance 528 is 5 KOhms.

The current I(3) is based on a voltage across the resistance 530 (identified in FIG. 5 as V(3)) and the resistance of the resistance 530 (identified in FIG. 5 as "R"). As previously described, the voltage at the node between the resistance 530 and the transistor 532 is set by the VGATE voltage and the threshold voltage Vtp. For the present example, it is assumed that VGATE is 1.0 V−Vtp, which results in the voltage at the node between the resistance 530 and the transistor 532 of 1.0 V. The voltage V(3)=[supply voltage (VDD2)−1.0 V], and the current I(3)=V(3)/R, with the rate of change of the current I(3) set by the resistance R. In contrast to current I(2), current I(3) is dependent on the supply voltage. In particular, as previously described, the current I(3) increases as the supply voltage increases and the current I(3) decreases as the supply voltage decreases.

Understanding the relationship between the current I(2) and the supply voltage (not dependent on supply voltage) and between the current I(3) and the supply voltage, it can be understood that the IBIAS current varies based on the current I(3) from the current source 534. In particular, the IBIAS current decreases with increasing supply voltage and the IBIAS current increases with decreasing supply voltage. As a result of the rate of change of the I(3) current being based on the resistance R of the resistance 530, the rate of change of the IBIAS current may also be based at least in part on the resistance R of the resistance 530.

As previously described, the IBIAS current and VBIAS voltage may be provided to a buffer circuit to control power circuits of the buffer circuit in order compensate for changes in a path delay resulting from variations in operating conditions, such as variations in supply voltage.

For example, in an embodiment of the disclosure where the bias circuit 500 provides the IBIAS current and VBIAS voltage to the buffer circuit 420 of FIG. 2, the transistor 524 may be coupled with transistors of the power circuits 436, 438, and 446 in a current mirror configuration. That is, the transistor 524 has its gate and drain coupled to the gates of the transistors of the power circuits 436, 438, and 446. The transistors of the power circuits 436, 438, and 446 may be scaled relative to the transistor 524 to scale current provided by the power circuits 436, 438, and 446 relative to the IBIAS current. For example, in some embodiments of the disclosure, transistors of the power circuits 436, 438, and 446 are scaled to provide five times the current of the IBIAS current. That is, with reference to FIG. 4, I(436)=I(438)=I(446)5× IBIAS (IBIAS=I(4) in FIG. 4). In other embodiments of the disclosure, the scaling of current provided by the respective power circuits may be different from one or more of each other, and/or may be different than a scaling of five times the IBIAS current.

As previously described, the mode circuit 540 may be used to control the bias circuit 500 to operate in different operation modes based on a MODE signal. For example, a high logic level MODE signal controls the bias circuit 500 to operate in a first operation mode and a low logic level MODE signal controls the bias circuit 500 to operate in a second operation mode. The second operation mode will be described and then the first operation mode will be described.

In the second operation mode the transistor 542 is active due to the low logic level MODE signal. The active transistor 542 couples the resistance 544 between the node 522 and the node 526 to provide a current path for the current IMODE through the mode circuit. As a result of the activated transistor 542 and the IMODE current, the IBIAS current will not decrease below a minimum current despite the supply voltage increasing above a voltage limit. A minimum IMODE current may be needed to adequately bias power circuits of a buffer circuit to provide sufficient power for operation. For example, in embodiments of the disclosure where the IBIAS current and VBIAS voltage are provided to the buffer circuit 420 of FIG. 4, the minimum IBIAS current causes the power circuits 436 and 438 of the input stage 430 to provide sufficient power for the amplifier circuits 432 and 434 to be activated and operate.

FIG. 6A is a diagram showing various currents during operation of the bias circuit 500 for a second operation mode according to an embodiment of the disclosure. The abscissa shows supply voltage VDD2 and the ordinate shows current I. As previously described, the IBIAS current is the difference between the I(2) current of the resistance 528 and the I(3) current of the current source 534. The I(2) current generally remains constant and is unaffected by changes in the supply voltage, while the I(3) current increases as the supply voltage increases, thus, resulting in a decreasing IBIAS current for increasing supply voltage. The I(3) current begins increasing for increasing supply voltage after the supply voltage exceeds a voltage at a node between the resistance 530 and the transistor 532, which as previously described, is set by the voltage of the VGATE voltage.

In the embodiment shown in FIG. 6A, the VGATE voltage is assumed to be (1.0 V−Vtp). As the supply voltage exceeds 1.0 V, the transistor 532 is activated and the I(3) current increases as the supply voltage increases. As a result, the IBIAS current decreases as the supply voltage increases. The change in I(3) current due to a change in the supply voltage is shown for three different resistances R1, R2, and R3 of the resistance 530. As previously described, the rate of change of the I(3) current is based on the resistance R of the resistance 530. The current I(3)1 corresponds to the resistance R1, the current I(3)2 corresponds to the resistance R2, and the current I(3)3 corresponds to the resistance R3. The resistance R1 is less than the resistance R2, and the resistance R2 is less than the resistance R3.

As also previously described, as a result of the rate of change of the I(3) current being based on the resistance R of the resistance 530, the rate of change of the IBIAS current may also be based at least in part on the resistance R of the resistance 530. The resulting IBIAS current is also shown in FIG. 6A for the three different resistances, with IBIAS1 current corresponding to the resistance R1, the IBIAS2 current corresponding to the resistance R2, and the IBIAS3 current corresponding to the resistance R3. Due to the IMODE current, which increases with increasing supply voltage, the IBIAS current will not decrease below a minimum current despite the supply voltage increasing above the voltage limit. The minimum current is set by the IMODE current. The IBIAS current will increase with the IMODE current as the supply voltage continues to increase above the voltage limit.

With reference again to FIG. 5, in a first operation mode the transistor 542 is not active due to the high logic level MODE signal. The inactive transistor 542 results in a single current path through the transistor 520 from the node 526 to the node 522, which allows the IBIAS current to continue decreasing to below the minimum IBIAS current of the second operation mode as the supply voltage increases. The IBIAS current continues to decrease until the I(3) current of the current source 534 is equal to the I(2) current of the resistance 528, at which point the IBIAS current is essentially zero.

FIG. 6B is a diagram showing various currents during operation of the bias circuit 500 for a first operation mode according to an embodiment of the disclosure. The abscissa shows supply voltage VDD2 and the ordinate shows current I. Similar to the second operation mode of FIG. 6A, the I(2) current generally remains constant and is unaffected by changes in the supply voltage, while the I(3) current increases as the supply voltage increases, thus, resulting in decreasing IBIAS current for increasing supply voltage. Again assuming that the VGATE voltage is (1.0 V=Vtp), as the supply voltage exceeds 1.0 V, the transistor 532 is activated and the I(3) current increases as the supply voltage increases. As a result, the IBIAS current decreases as the supply voltage increases.

In contrast to the second operation mode of FIG. 6A, the IBIAS current continues to decrease with increasing supply voltage to below the minimum current of the second operation mode. With the transistor 542 of the mode circuit 540 being inactive, the IMODE current is zero, and does not set a minimum current for the IBIAS current. The IBIAS current decreases until zero, which is the point when the I(3) current of the current source 534 is equal to the I(2) current of resistance 528. As the supply voltage increases beyond this point, the I(2) current increases with the increasing I(3) current.

The first operation mode may be used when it is desirable for IBIAS to continue decreasing with increasing supply voltage to less than a minimum current of the second operation mode. For example, the first operation mode may be used to evaluate performance of circuits that rely on the IBIAS current and/or VBIAS voltage for operation, such as circuits in a buffer circuit (e.g., bias circuit 420 of FIG. 4). As previously described, with reference to FIG. 4, the input stage 430 has a minimum current and/or voltage necessary to operate. However, where the performance of the input stage 430 is evaluated relative to the current and/or voltage provided by the IBIAS current and VBIAS voltage of the bias circuit 500, the first operation mode allows evaluation below the minimum IBIAS current of the second operation mode. The second operation mode may be used under normal operating conditions, where it is desirable for the IBIAS current to have a minimum current. The minimum current may be a current sufficient to ensure circuits relying on the IBIAS current and/or VBIAS voltage to continue to operate normally despite the supply voltage increasing beyond a voltage limit.

Figures 7, 8:
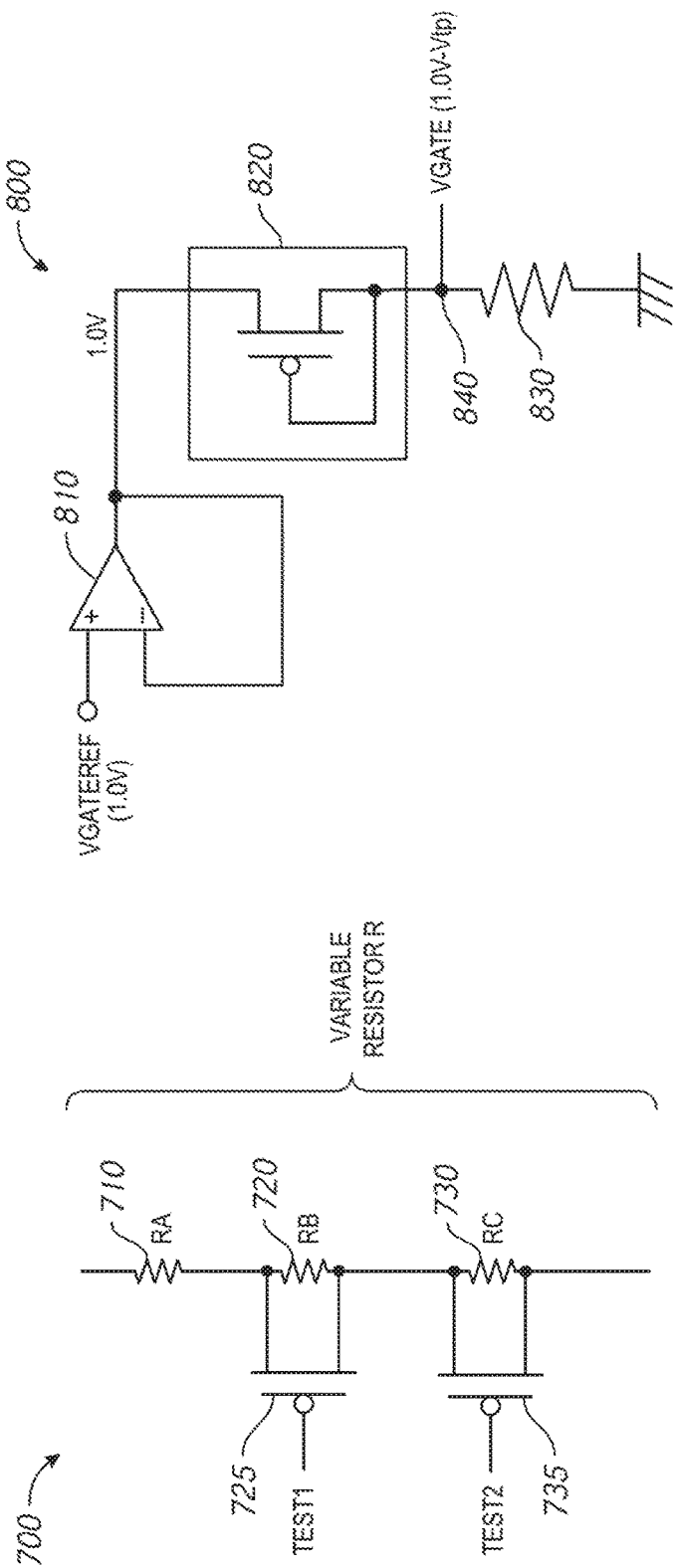
FIG. 7 is schematic diagram of a resistance according to an embodiment of the disclosure.
FIG. 8 is schematic diagram of a bias circuit according to an embodiment of the disclosure.

FIG. 7 is schematic diagram of a resistance 700 according to an embodiment of the disclosure. The resistance 700 may be adjustable to provide different resistances. The resistance 700 may be included in the resistance 530 of FIG. 5 in some embodiments of the disclosure, for example, where the resistance 530 is adjustable.

The resistance 700 includes resistances 710, 720, and 730 coupled in series. The resistance 710 has a resistance RA, the resistance 720 has a resistance RB, and the resistance 730 has a resistance RC. The resistance 700 further includes bypass transistor 725 coupled in parallel to resistance 720 and bypass transistor 735 coupled in parallel to resistance 730. The bypass transistors 725 and 735 may be activated by respective activation signals TEST1 and TEST2. When the bypass transistor 725 is activated (e.g., logic low level TEST1) the resistance 720 is bypassed and when the bypass transistor 735 is activated (e.g., logic low level TEST2) the resistance 730 is bypassed. The activation signals TEST1 and TEST2 may be provided by a control circuit (not shown), for example, a test mode control circuit that provides various signals (including activation signals) to perform testing of circuits in an integrated circuit.

By controlling activation of the bypass transistors 725 and 735, the resistance of the resistance 700 may be adjusted. For example, when both bypass transistors 725 and 735 are activated the resistance 700 has a resistance RA. When the bypass transistor 725 is not activated and the bypass transistor 735 is activated the resistance 700 has a resistance RA+RB. When the bypass transistor 725 is activated and the bypass transistor 735 is not activated the resistance 700 has a resistance RA+RC. Finally, when both the bypass transistors 725 and 735 are not activated the resistance 700 has a resistance RA+RB+RC.

The resistances 710, 720, and 730 may have the same resistance values in some embodiments of the disclosure. In other embodiments of the disclosure, one or more of the resistances 710, 720, and 730 may be different.

FIG. 8 is a schematic diagram of a gate bias circuit 800 according to an embodiment of the disclosure. The gate bias circuit 800 provides a bias voltage VGATE. The gate bias circuit 800 may be used to provide the VGATE voltage to the transistor 532 of FIG. 5 in some embodiments of the disclosure.

The gate bias circuit 800 includes an amplifier circuit 810 configured as a voltage follower circuit. In particular, the amplifier circuit 810 has a positive (+) input provided with a reference voltage VGATEREF and has an output coupled to a negative (−) input. The output of the amplifier circuit 810 has a voltage that is equal to the reference voltage VGATEREF. The gate bias circuit 800 further includes a load circuit 820 and a resistance 830 coupled in series between the output of the amplifier circuit 810 and a power supply line providing a reference voltage (e.g., ground). The load circuit 820 may be coupled to the output of the amplifier circuit 810 through a reference line which is provided with the reference voltage VGATEREF. The load circuit 820 and the resistance 830 are coupled at a node 840 from which the VGATE voltage is provided. The load circuit 820 may include a transistor in some embodiments of the disclosure, as shown in FIG. 8. The load circuit 820 may include additional or alternative circuits in other embodiments of the disclosure.

The load circuit 820 provides a load to reduce the voltage at the output of the amplifier circuit 810 (e.g., VGATEREF) by a voltage equal to a threshold voltage of the transistor of the load circuit 820. The threshold voltage of the transistor of the load circuit 820 may model a threshold voltage of a transistor to which the VGATE voltage is provided. For example, in an embodiment where the gate bias circuit 800 provides the VGATE voltage to the transistor 532 of the gate bias circuit 500 (FIG. 5), the load circuit 820 provides a load to reduce the VGATEREF voltage by the threshold voltage of the transistor 532. The load circuit 820 is shown as a load coupled p-channel transistor for the embodiment of FIG. 8. In embodiments of the disclosure wherein the gate bias circuit 800 provides the VGATE voltage to the transistor 532 of the gate bias circuit 500, the p-channel transistor of the load circuit 820 matches the transistor 532 (e.g., having the same transistor characteristics, including the same threshold voltage Vtp).

In operation, a VGATEREF voltage is provided to the amplifier circuit 810 and the amplifier circuit 810 provides an output voltage having a voltage equal to the VGATEREF voltage. The VGATEREF voltage at the output of the amplifier circuit 810 is reduced by a voltage across the load circuit 820 to provide a VGATE voltage at the node 840. As a result, the resulting VGATE voltage provided at the node 840 is (VGATEREF−voltage across load circuit 820).

The gate bias circuit 800 may be used to accurately provide a VGATE voltage. In embodiments wherein the gate bias circuit 800 provides the VGATE voltage to the transistor 532 of the bias circuit 500 of FIG. 5, the voltage at the node between the resistance 530 and the transistor 532 may be accurately set. In a non-limiting example, the supply voltage VDD2 may be in a range between 1.06 V and 1.17 V. Thus, the supply voltage may vary over 0.11 V. In embodiments of the disclosure where the IBIAS current and VBIAS voltage are provided to buffer circuit 420 of FIG. 4, the IBIAS current and/or VBIAS voltage provided by the bias circuit 500 will vary as the supply voltage varies.

As previously described, the varying IBIAS current and VBIAS voltage may be used to maintain a timing through the buffer circuit 420. Where the VGATE voltage drifts, for example, to provide a voltage of 1.1 V between the resistance 530 and the transistor 532, the bias circuit 500 may not be able to adjust the IBIAS current and VBIAS voltage when the supply voltage is between 1.06 V to 1.1 V. Not being able to adjust the IBIAS current and the VBIAS voltage may result in the inability to cancel out any delay shifts of the output stage 450 for the supply voltage between 1.06 V to 1.1 V using the input stage 430 and the inverter stage 440, as previously described.

Where the VGATE voltage drifts, for example, to provide a voltage of 0.9 V between the resistance 530 and the transistor 532, the IBIAS current and VBIAS voltage may be adjusted as the supply voltage varies. However, the voltage of 0.9 V between the resistance 530 and the transistor 532 causes the I(3) current to be increased and the IBIAS current to be decreased. As a result, a decreased IBIAS current may be insufficient for each of the power circuits 436 and 446 to capture data in the input stage 430 and the inverter stage 440.

Thus, it may be desirable in some embodiments of the disclosure to accurately and stably provide a VGATE voltage to set a voltage between the resistance 530 and the transistor 532 to 1.0 V. The gate bias circuit 800 may be used to provide the VGATE voltage in such embodiments of the disclosure.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus comprising:
   a power supply line configured to provide a supply voltage;
   first and second nodes;
   an impedance element coupled between the power supply line and the first node;
   a first transistor having a gate, a source coupled to the first node, and a drain coupled to the second node;
   a reference line configured to provide a reference voltage;
   a second transistor having a gate, a source coupled to the reference line, and a drain, the gate and the drain of the second transistor coupled to the gate of the first transistor;
   an additional power supply line configured to provide an additional supply voltage;
   an additional impedance element coupled between the second node and the additional power supply line;
   a third node;
   a third transistor coupled between the power supply line and the third node; and
   a fourth transistor coupled between the third node and the second node,
   wherein a bias current flows through the third transistor and the fourth transistor, the apparatus further comprising an input buffer coupled to the third node, the input buffer being configured to amplify external data with consumption of a current generated responsively to the bias current.

2. The apparatus of claim 1, wherein the fourth transistor is controlled to keep the second node at a first voltage regardless of a value of the supply voltage.

3. The apparatus of claim 1 wherein the input buffer comprises a transistor and the third transistor is configured to be coupled with the transistor of the input buffer as a current mirror circuit.

4. The apparatus of claim 1 wherein a voltage of the first node is equal to a sum of a threshold voltage of the first transistor and the reference voltage provided by the reference line that is reduced by the voltage across the second transistor.

5. The apparatus of claim 1, further comprising an amplifier circuit configured as a voltage follower and configured to provide the reference voltage to the reference line.

6. The apparatus of claim 1 wherein the impedance element comprises an adjustable resistance.

7. The apparatus of claim 1, further comprising:
   an additional power supply line configured to provide an additional supply voltage; and
   an additional impedance element coupled between the drain of the second transistor and the additional power supply line.

8. An apparatus comprising:
   a power supply line configured to provide a supply voltage;
   first and second nodes;
   an impedance element coupled between the power supply line and the first node;
   a first transistor having a gate, a source coupled to the first node, and a drain coupled to the second node;
   a reference line configured to provide a reference voltage;
   a second transistor having a gate, a source coupled to the reference line, and a drain, the gate and the drain of the second transistor coupled to the gate of the first transistor;
   an additional power supply line configured to provide an additional supply voltage;
   an additional impedance element coupled between the second node and the additional power supply line;
   a third node;
   a third transistor coupled between the power supply line and the third node;
   a fourth transistor coupled between the third node and the second node; and
   an amplifier circuit having an output coupled to a gate of the fourth transistor, and further having a first input configured to receive a second reference voltage and a second input coupled to the second node.

* * * * *